(12) United States Patent
Castleman

(10) Patent No.: US 6,506,065 B1
(45) Date of Patent: *Jan. 14, 2003

(54) REFINED RACK-AND-PANEL CONSTRUCTION WITH SELF-LOCKING CONNECTORS; AND METHOD OF USE

(75) Inventor: Neal J. Castleman, Malibu, CA (US)

(73) Assignee: Ergo Mechanical Systems, Incorporated, Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/677,331

(22) Filed: Sep. 28, 2000

(51) Int. Cl.$^7$ ............................................... H01R 13/62
(52) U.S. Cl. ...................... 439/157; 439/160
(58) Field of Search ................................ 439/157, 372, 439/61, 310, 357, 160, 159; 361/724, 725, 826, 825

(56) References Cited

U.S. PATENT DOCUMENTS 5,831,821 A * 11/1998 Scholder et al. ............ 361/686

* cited by examiner

Primary Examiner—Tho D. Ta
Assistant Examiner—Phuongchi Nguyen
(74) Attorney, Agent, or Firm—Ashen & Lippman

(57) ABSTRACT

Electrical connections between a cable connector and an electronics module—that has a corresponding panel connector—are made/broken quickly and easily with a light, low-bulk half-shell that is an exclusively mechanical, nonelectrical intermediary from connector to module. A rack receives and holds the module, and a connector holder, formed in the rack, receives and holds the cable and panel connectors aligned. A cam is associated with the rack or module, and a cam-follower with the other—preferably in duplicate opposed sets. A single, one-hand-actuated lever on the rack or module operates the cam or follower to bodily shift module vs. rack and engage/disengage the connectors. Preferences: each holder easily and quickly engages/disengages from a corresponding cable connector. Typically a module weighs at least several pounds. The cam has a concave arcuate segment to draw the module in and seat the connectors, and a convex arcuate segment to eject the module and unseat them. The lever hinges to the rack; the cam is formed in the lever; the follower is a post projecting laterally from the module. A latch-pin fastener on the lever helps secure it and the rack and module fully engaged. Offset alignment rods project forward from the module through holes in the rack to prevent inverted installation. The method inserts the module partway into the rack and then operates the lever with one hand to draw the module in and seat the connectors.

29 Claims, 11 Drawing Sheets

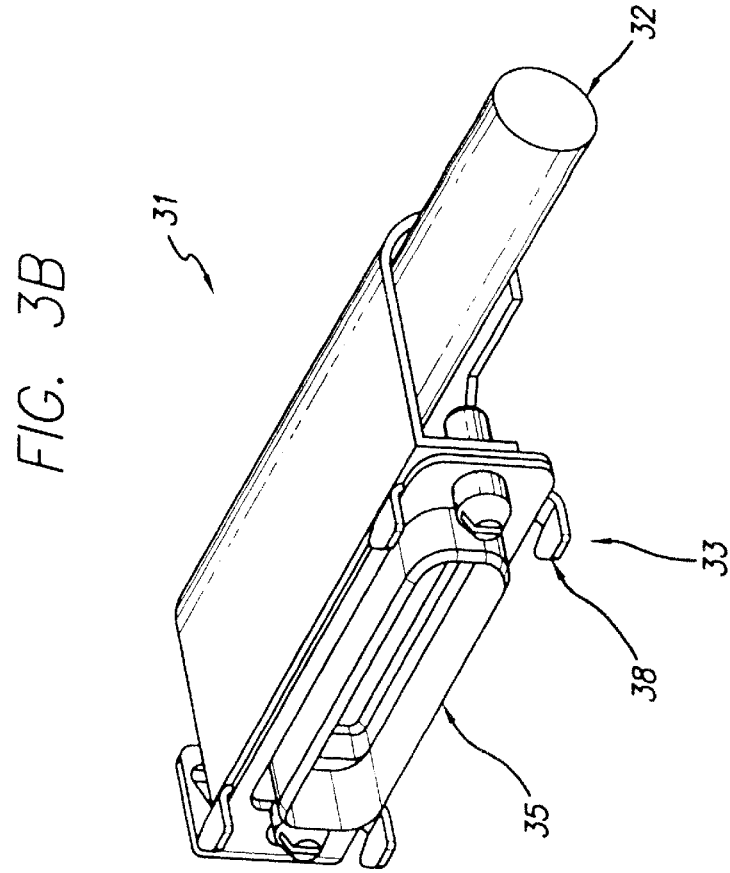
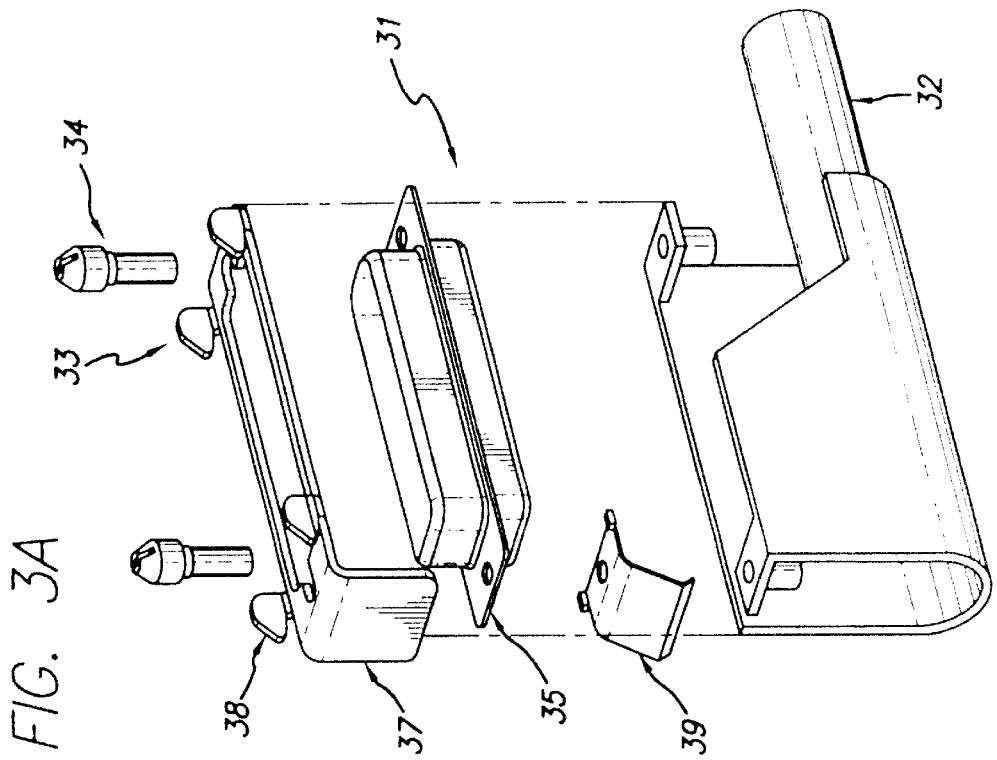

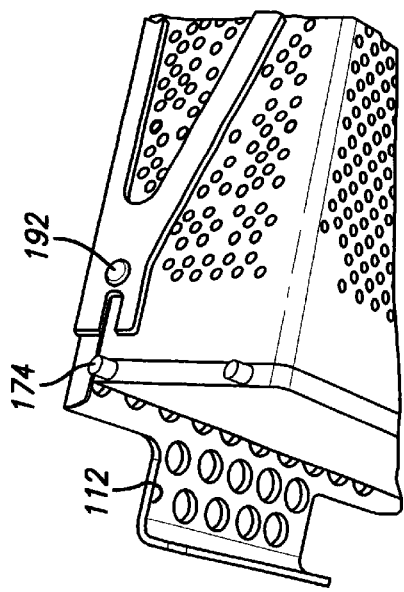
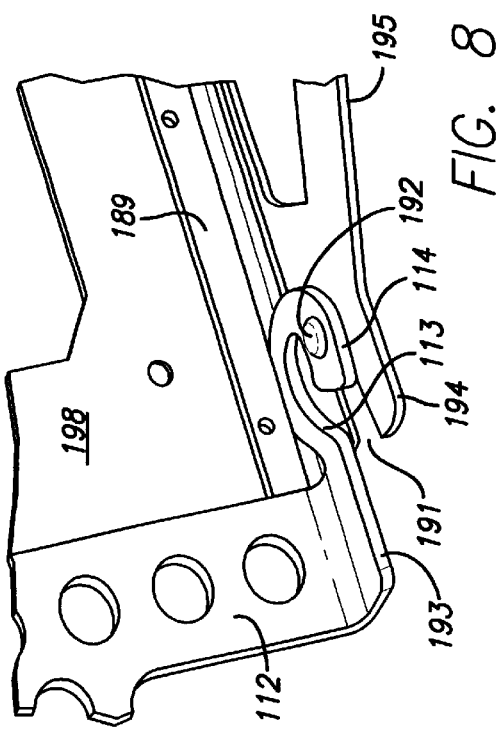
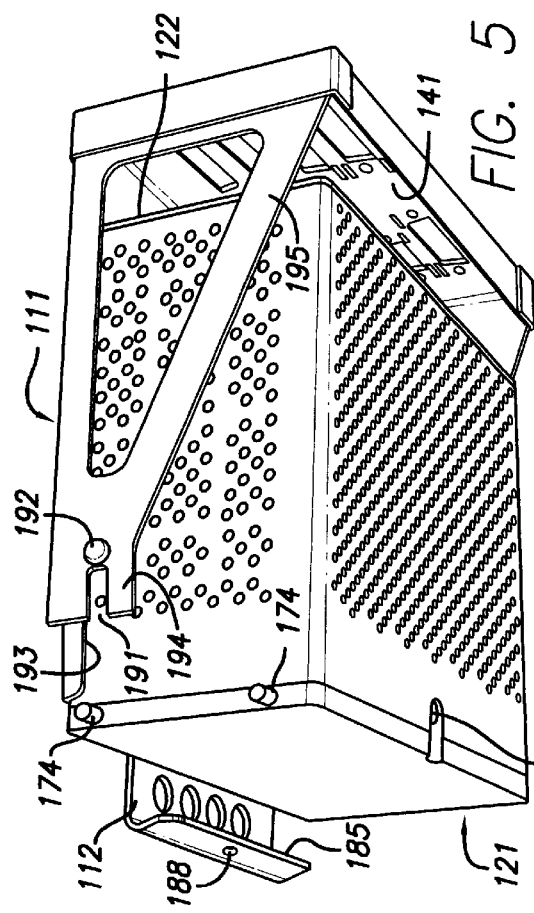
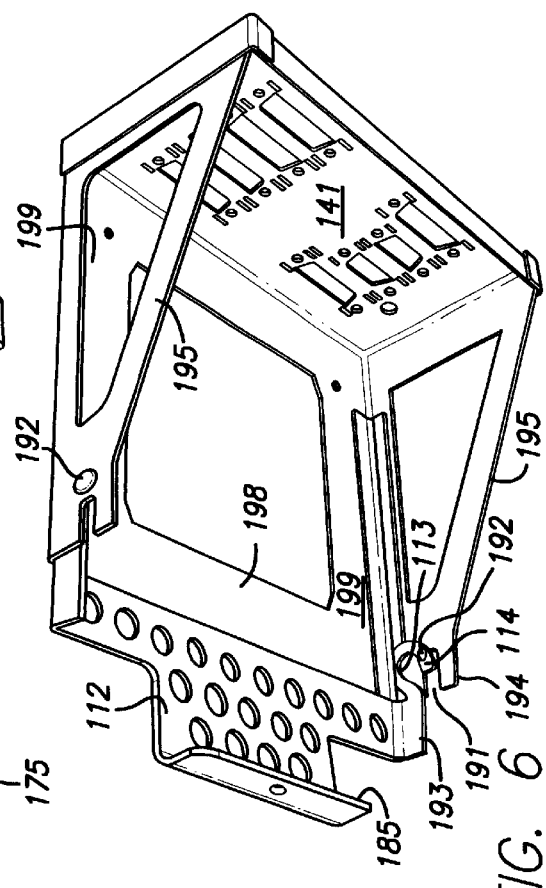

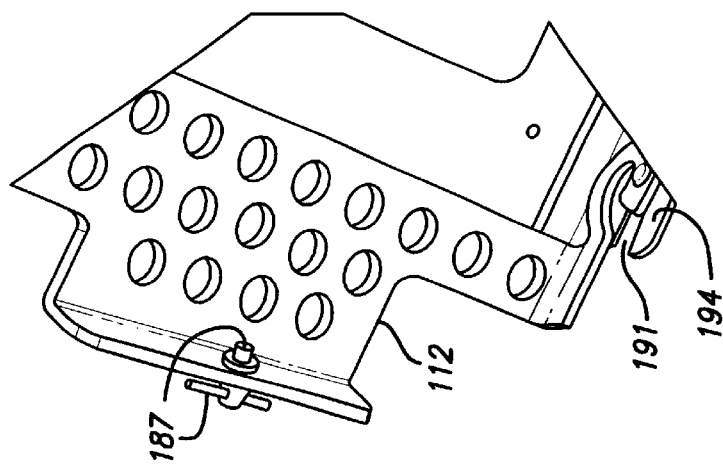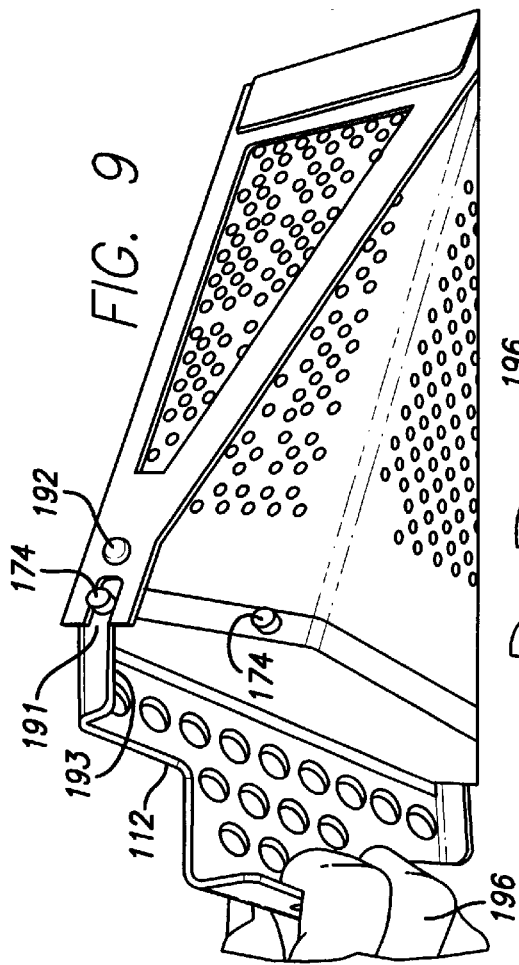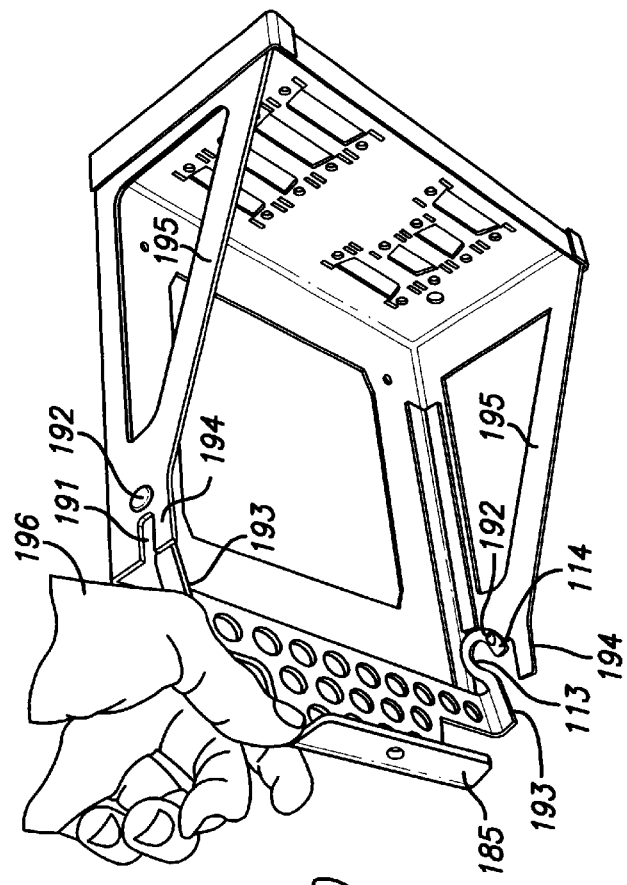

REFINED RACK-AND-PANEL CONSTRUCTION WITH SELF-LOCKING CONNECTORS; AND METHOD OF USE

RELATED PATENT DOCUMENTS

The inventor's earlier patent document, copending U.S. utility-patent application Ser. No. 09/022,850, since issued as U.S. Pat. No. 6,261,111, is fully incorporated by reference into this present document. A closely related document is U.S. Pat. No. 5,409,394 of Astier.

FIELD OF THE INVENTION

This invention relates generally to equipment and procedures for making wiring connections, and more particularly to equipment and procedures for quickly and easily making and breaking a large number of cable connections to an electronics module simultaneously, or any of such connections selectively. The invention is also applicable to facilitating the making or breaking of multiple-conductor connections if all the wiring passes through only a few cable connectors, or even just one.

BACKGROUND OF THE INVENTION

A common apparatus used by the airline industry is an electronics module. Each electronics module is connected to other equipment by cables. An electronics module utilizes a common device, to make and break these cable connections, called a cable connector.

One category of electronics module contains equipment which operates a variety of functions in an aircraft passenger cabin. There is typically one electronics module for each row of passenger seats on an airliner. In a commercial airliner an electronics module is commonly mounted under a seat, and therefore is inconvenient or awkward to reach.

During flight, aircraft undergo a significant amount of vibration. Therefore, the electronics modules should be securely fastened to the aircraft and the cable connectors should be securely fastened to the electronics module. The electronics modules and the cable connectors, however, also require testing, repair and replacement, and therefore must be removable. For these purposes different designs are now in use, as set forth in detail in the inventor's above-mentioned earlier patent document.

Such removal of electronics modules is quite frequent. In the airline industry, however, profit is made only by flying, and enormous loss or expense is incurred whenever aircraft must remain on the ground because of testing and repair.

Of course many spare modules can be kept available, so that a jetliner need not be delayed for the entire duration of testing and repair of a malfunctioning electronics module. Nevertheless the sensitivity of airline operations to idle time is so great that even a few minutes' delay for removal or replacement—or for the availability of a highly trained technician to perform such procedures—represents monumental cost.

Detailed discussion in the earlier patent document covers prior-art nonrack and rack configurations for mounting of electronics modules. That discussion shows that nonrack designs created routine maintenance processes that were extremely labor intensive and time consuming—whether the task at hand was simply changing out an electronics module or involved troubleshooting the cable connectors or wiring harness.

The discussion also shows that rack designs establish an intermediary or interface, between the cables and the electronics module, that is both mechanical and electrical. The rack is a mechanical intermediary, and the unitary cable connector is an electrical intermediary.

Establishment of this electromechanical intermediary greatly improves half of the maintenance effort, namely the ease and efficiency of changing out electronics modules—although procedures remain cumbersome as to seating or unseating of multiple connections at the same time. As to cable troubleshooting, however, rack designs fail to make significant improvement.

Discussion in the earlier document also covers details of the Astier cable-connector patent, which teaches use of a locking element with several hooks for attaching individual cable connectors to a panel. The connectors, as introduced by Astier, still must be individually disconnected from the electronics module in order to-remove the module.

In general the precursor invention satisfactorily resolves all the above-discussed problems in the art. It has been found, however, slightly bulkier than optimum—leading in some unusual cases to interferences with other apparatus in closely confined spaces of commercial aircraft. In addition it is very slightly heavier than optimally desired.

From the preceding descriptions, it is apparent that prior-art devices currently being used have significant disadvantages. Even the precursor invention may be subject to useful refinement.

SUMMARY OF THE DISCLOSURE

The present invention introduces such refinement. In its preferred embodiments, the present invention has several aspects or facets that can be used independently, although they are preferably employed together to optimize their benefits.

In preferred embodiments of a first of its facets or aspects, the invention is apparatus for making or breaking electrical connections between at least one electrical cable connector and an electronics module that has at least one corresponding panel connector, and that also carries module camming means. The module camming means are either a cam or a cam-follower; they are part of the electronics module. The module and cable connector are elements of the context or environment of the invention, not elements of the invention itself.

The apparatus of the invention includes an exclusively mechanical, nonelectrical intermediary between the cable connector and electronics module. The intermediary in turn includes a rack for receiving and holding the electronics module.

The apparatus also includes at least one cable-connector holder, formed in the rack. This holder receives and holds the at least one cable connector in positions that are aligned with the at least one panel connector when the electronics module is held in the rack;

The apparatus also includes rack camming means. These camming means are either a cam-follower or a cam, and complementary to the module camming means mentioned just above. It will be understood that the rack camming means and module camming means are mutually engageable to provide relative force as between the rack and module.

In addition the apparatus includes a lever fixed to either the rack or module for operating the rack camming means or module camming means. When operated, these camming means forcibly shift the module relative to the rack, so as to engage or disengage the at least one panel connector and the at least one cable connector.

The foregoing may represent a description or definition of the first aspect or facet of the invention in its broadest or most general form. Even as couched in these broad terms, however, it can be seen that this facet of the invention importantly advances the art.

In particular, this aspect of the invention relies upon intrinsically more-compact and lighter-weight camming means, distributed as between the rack (of the invention) and the module (forming part of the operating environment of the invention)—rather than an intrinsically more-extended and heavier linkage device that is wholly in the rack as in the precursor invention. As will be seen this shared functionality, together with reliance on camming rather than a linkage, is key to a much lighter and much less bulky overall construction.

It is correspondingly much more satisfactory in the stringently confined and weight-sensitive aircraft environment. The rack of the present invention can be used only when an electronics module with suitable complementary camming means is available.

Although the first major aspect of the invention thus significantly advances the art, nevertheless to optimize enjoyment of its benefits preferably the invention is practiced in conjunction with certain additional features or characteristics. In particular, preferably each cable-connector holder includes some means for easily and quickly engaging, or disengaging from, its corresponding cable connector.

Another preference that is particularly notable when the electronics module weighs at least several pounds—as is commonplace—is that the lever be a single lever for manual actuation by one hand, and that the cam and follower bodily move the electronics module. Yet another preference is that the camming means (i. e. the rack camming means and module camming means considered in the aggregate together) include substantially duplicate cam-and-follower sets at opposed sides of the module, both sets operated by said single lever when manually actuated by one hand.

It will be recognized, however, that only half of the camming means are in the rack—which is to say, in the invention. Thus this latter preference implies that the rack camming means, which are part of the invention, be either substantially duplicate cams or substantially duplicate followers.

In still another preference, the rack camming means include a first cam segment for forcible drawing of the module into the rack to firmly seat the panel connector with the cable connector, and a second cam segment for forcible ejection of the module slightly out of the rack to unseat the panel connector from the cable connector. When this preference is observed, then it is further preferable that the first segment have a concave arcuate surface for pulling the follower and the second segment have a convex arcuate surface for pushing the follower.

It is also preferable that the cam be formed in the lever, and the follower be a post projecting laterally from the module to engage the cam. Where applicable, it is also preferred that the lever be hinged to the rack.

Fastening means are preferably provided on the lever for helping to secure the lever, and the rack and module, in a fully engaged condition. When present, the fastening means preferably include a latch pin for engaging an aperture in the module.

Another preference is that the apparatus include offset alignment rods projecting forward from the module, and through holes in the rack when properly aligned, to prevent inverted installation. When present, these rods are preferably long enough to stop the forcible drawing of the module into the rack before the panel connectors engage the cable connectors—in event of attempted inverted installation.

In preferred embodiments of its second major independent facet or aspect, the invention is an electrical interconnection system. It includes at least one electrical cable connector, and an electronics module that has at least one corresponding panel connector.

The system also includes a rack for receiving and holding the electronics module. Further included is at least one cable-connector holder, formed in the rack, for receiving and holding the at least one cable connector in positions aligned with the at least one panel connector when the electronics module is held in the rack.

In addition the system includes a cam and cam-follower. The cam is associated with either the rack or the module, and the follower with the other. A lever is fixed to the rack or module for operating the cam or follower. When the lever is actuated, the module is forcibly shifted relative to the rack, so as to engage or disengage the at least one panel connector and the at least one cable connector.

The foregoing may represent a description or definition of the second aspect or facet of the invention in its broadest or most general form. Even as couched in these broad terms, however, it can be seen that this facet of the invention importantly advances the art.

In particular, this facet of the invention provides the rack and module tailored together as a set. This more reliably ensures all of the weight and compactness benefits introduced above with respect to the rack that is the first aspect of the invention.

Although the second major aspect of the invention thus significantly advances the art, nevertheless to optimize enjoyment of its benefits preferably the invention is practiced in conjunction with certain additional features or characteristics. In particular, preferably all the preferences described above for the first facet of the invention are equally applicable to this second aspect.

In preferred embodiments of its third major independent facet or aspect, the invention is a method of interconnecting numerous cable connectors with corresponding numerous panel connectors of an electronics module that has opposed laterally projecting posts, using a rack that receives the module at one side of the rack and receives the panel connectors at another side of the rack and that has a single hinged-lever carrying opposed cams formed in the lever for engaging the posts. The method includes the step of inserting the electronics module partway into the rack.

It also includes the step of then operating the lever with one hand to actuate the cams against the posts, so as to bodily shift the module further into the rack. This step thereby seats all the cable connectors and corresponding panel connectors substantially simultaneously.

The foregoing may represent a description or definition of the third aspect or facet of the invention in its broadest or most general form. Even as couched in these broad terms, however, it can be seen that this facet of the invention importantly advances the art.

In particular, this aspect of the invention actually brings home the previously discussed constructional benefits in terms of a procedure for use by both installation and maintenance personnel. When new systems are first installed—and also later when maintenance is called for—the reduced bulkiness of the present invention is a significant advantage for personnel who must maneuver the module in and out of the rack.

By virtue of the refinements of the present invention, particularly including the one-hand operation of this third aspect, these new-installation and later-maintenance procedures are all much easier and surer.

Although the third major aspect of the invention thus significantly advances the art, nevertheless to optimize enjoyment of its benefits preferably the invention is practiced in conjunction with certain additional features or characteristics. In particular, preferably the apparatus preferences discussed above are applied in this method form of the invention as well.

All of the foregoing operational principles and advantages of the present invention will be more fully appreciated upon-consideration of the following detailed description, with reference to the appended drawings, of which:

BRIEF DESCRIPTION OF THE DRAWINGS

FIG. 3A is an exploded isometric view of the same side;

FIG. 3B is an isometric view of the cable connector assembled and with a cable attached;

FIG. 5 is a like view but showing the rear of the rack, and with the major elements advanced to the next stage of assembly—namely, the electronics module positioned mostly within the rack but the control posts on the module not yet engaging the slide on the rack door;

FIG. 6 is a like view but of the rack only, with the module removed for a clearer view of the rack interior;

FIG. 7 is a view like FIG. 5 but only partial, and with the major elements now advanced to a still further stage of assembly—namely, the electronics module shifted forward within the rack so that the control posts on the module now engage the door slide;

FIG. 8 is a view like FIG. 6 but enlarged, to more clearly show the door-hinge and cam mechanism;

FIG. 9 is a view like FIG. 7, but with the elements now almost completely assembled—particularly with the module shifted forward so that the control posts engage the door cam which draws the posts and module into final position, and with the door partially closed to draw the posts and module forward;

FIG. 10 is a view like FIG. 6, but with the door partially closed as in FIG. 9—and particularly showing the cam partly advanced;

FIG. 12 is a view like FIG. 6 but only partial, and enlarged to more clearly show the locking pin that deters inadvertent withdrawal of the module from the rack;

DETAILED DESCRIPTION OF THE PREFERRED EMBODIMENTS

Figure 1:
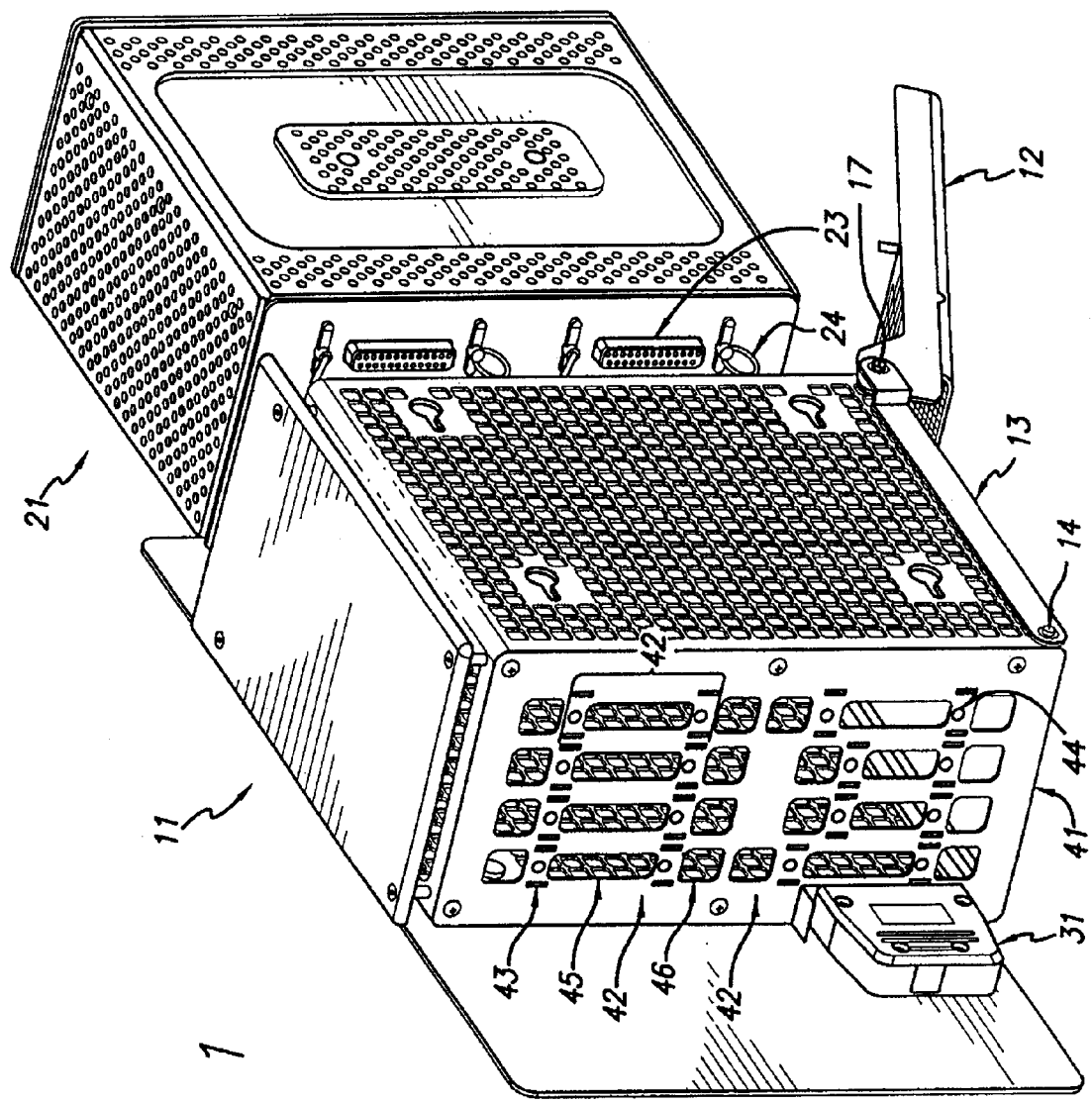
FIG. 1 is a drawing that is repeated from the inventor's above-mentioned earlier patent document and that shows the precursor rack-and-panel system to illustrate the cable-connection arrangements common to that system and the present invention, and also for comparison with the present invention; more specifically, it is an isometric view from above right, showing the front of that precursor rack—with the door open and the electronics module aligned to enter the back of the rack through the opening, and one cable connector aligned to enter one cable-connector holder.
Figure 1A:
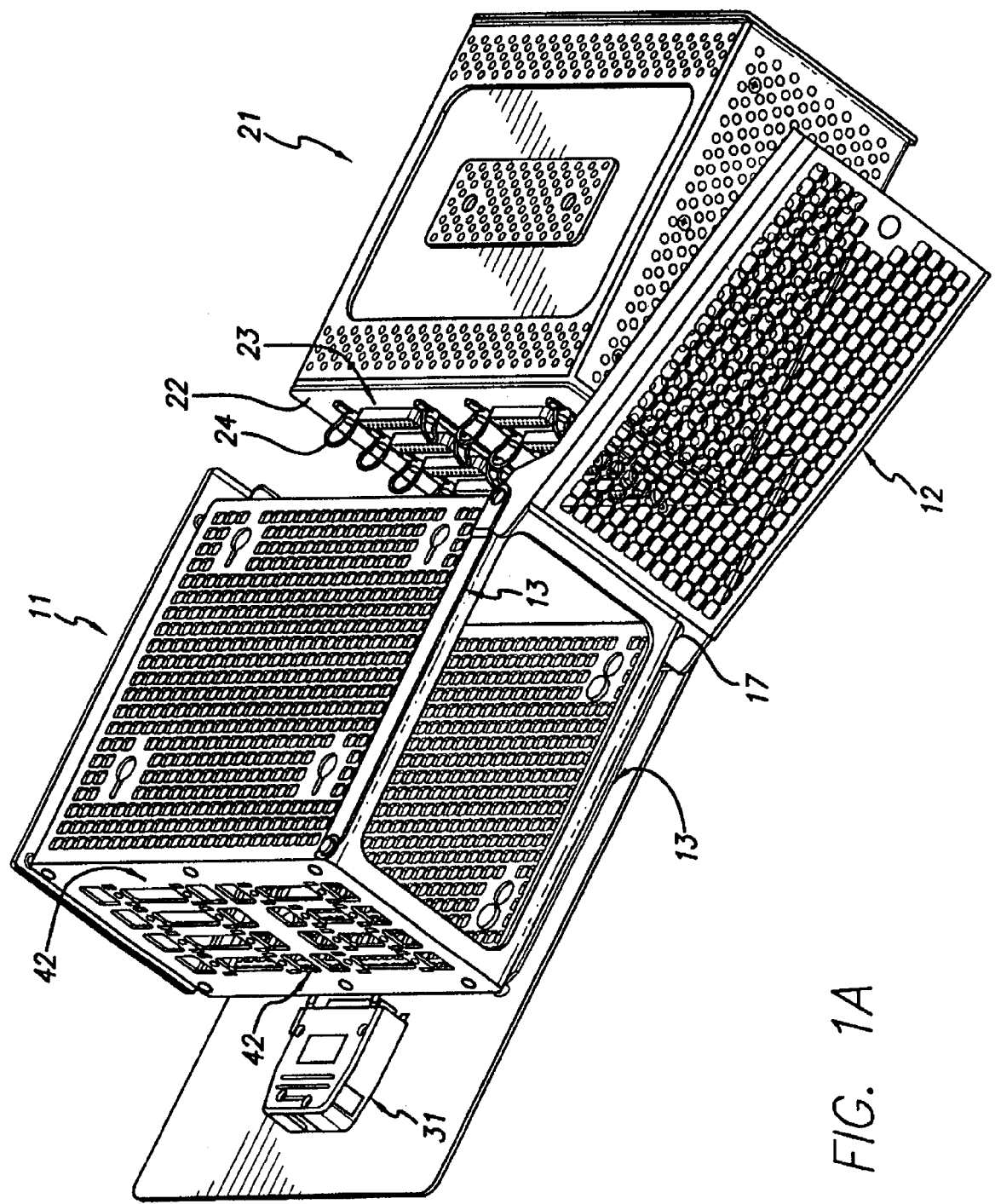
FIG. 1A is a like view of the precursor system from below right.
Figure 2:
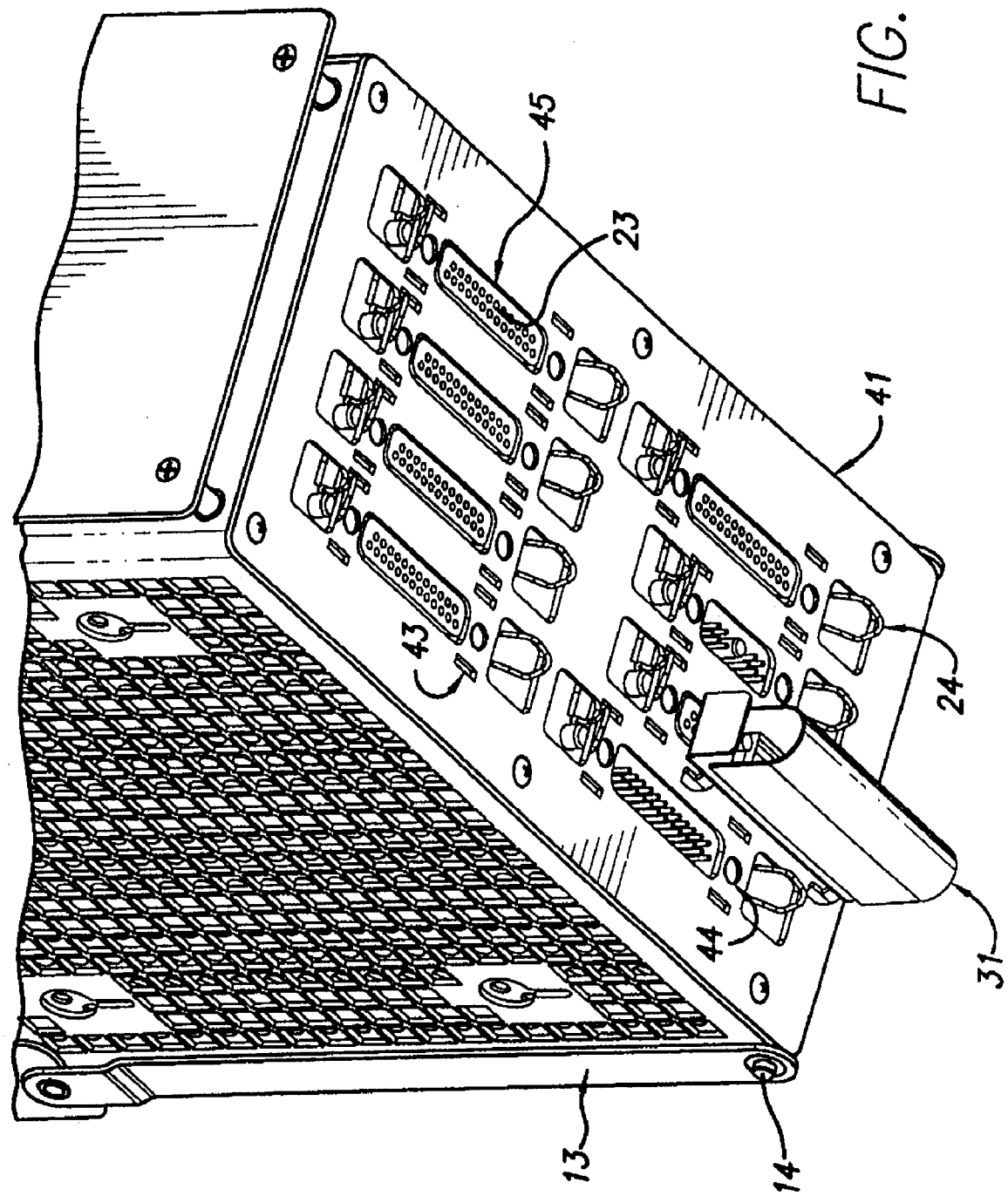
FIG. 2 is a like view from above left, and somewhat enlarged, but showing only the front and side of the precursor rack with the electronics module completely inside, and one cable connector aligned to enter one cable-connector holder.
Figure 2A:
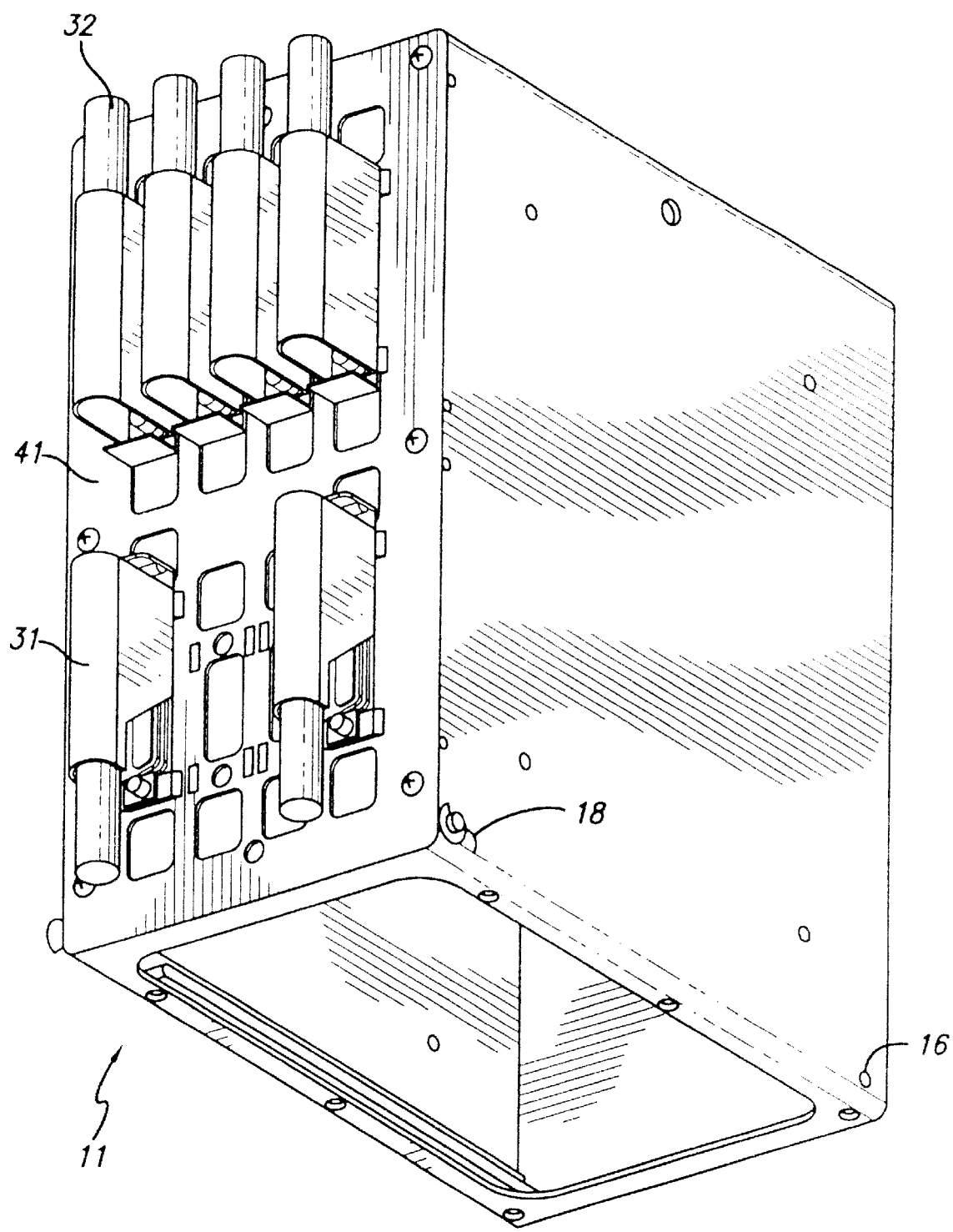
FIG. 2A is an isometric view of the precursor rack from below right front, with numerous cable connectors attached.

As first introduced in the inventor's above-mentioned earlier patent document, preferred embodiments of my invention provide a rack 11 which acts as a housing for an electronics module 21 (FIGS. 1 and 1A). FIGS. 1 through 2A most specifically show the precursor to the present invention.

Details of connector attachment, however, are common to the precursor invention and the present invention—and therefore FIGS. 1 through 2A equally well illustrate connector attachment details for both. As the present invention focuses upon mechanical details only, these showings from the earlier patent document shall be understood to represent the electrical connection details of the present invention.

The rack creates a mechanical intermediary between the electronics module and numerous. cable connectors. Thkis intermediary is different from the intermediary created by a prior-art rack design, also shown and discussed in the earlier patent document.

That prior-art rack design created a mechanical and electrical intermediary. The preferred embodiments of my invention create an exclusively mechanical intermediary, with a panel 41.

The front side of the rack carries the panel 41 with an array of cable-connector holders 42 (FIGS. 1 and 1A). The benefit of this structure is that it allows the electronics module to be disconnected from the cable connectors without disconnecting any cable connectors individually—but each cable connector can be quickly removed individually for troubleshooting access or the like as explained earlier.

Each cable-connector holder includes a connector aperture 45, defined in the panel, through which a cable connector 31 can engage a panel connector 22. Each cable-connector holder 42 also includes four slots 43 which are defined at the corners of the connector aperture 45 (FIG. 1).

These simple slots serve admirably as the previously introduced connector engaging or disengaging means, and are the form which I prefer. As mentioned earlier, however, various partial equivalents are available—for example notches or like cutouts that are not completely surrounded by material of the panel, or formed or attached hook structures that project outward to engage slots or other features formed in the cable connectors.

Also included are two circular apertures 44: one at each side of the connector aperture 45 respectively. Further included beyond the slot and circular aperture, at each side of the connector aperture, is an opening 46 for passage of a latch 24 on the electronics module 21. These square openings and latches are provided to give the invention backward compatibility with conventional cable connectors known heretofore; in preferred practice of my invention they are generally unused.

In the precursor invention, the electronics module 21 enters the rack through an orifice created when a door 12 is open. The front side of the electronics module is a panel 22 with an array of panel connectors 23 (FIGS. 1 and 1A). The latches 24 are located at opposite ends of each panel connector. These latches appear on electronics modules only to provide the invention backward compatibility.

The door 12 hinges at the bottom of the rack 11. Attached to the door, near the hinge, are two lever arms or linkages 13 (FIGS. 1 and 1A). Opening the door operates the two arms or linkages, which are positioned parallel to each other along the bottom of each side of the rack, and extend almost to the inside of the front panel 41 of the rack.

The lever arms pull back a rod when the door is opened. The rod is attached to the ends of the lever arms and is perpendicular to those lever arms. Therefore the rod pulls the electronics module 21 out of the rack when the door is open. The one-step process of opening the door completes two objectives. First the electronics module is unsecured; second, the rod pulls the module out of the rack.

This structure of lever and linkage is a particularly simple and effective form of means for disengaging the electronics module from the rack, and withdrawing all the connector pins—simultaneously—because it operates, in a sense, automatically in response to opening of the door. As will shortly become clear, however, the long linkage and full enclosure add needless weight to the overall assembly—and this, when multiplied by the many such devices that can be present in a typical passenger craft, represents a significant amount of extra weight.

When the electronics module 21 (FIG. 2) is completely inside the rack 11, each of the panel connectors 23 aligns with its corresponding cable-connector holder 42. The panel connectors are positioned such that they are approximately flush with the front panel 41 of the rack. The latches 24 pass through the openings 46 so that they can engage cable connectors if the cable connectors require them.

A cable connector 31 is shown properly aligned for connection to the rack 11 and the panel connector 23. Numerous cable connectors (FIG. 2A) can be attached to the rack, enabling the electronics module to operate (or otherwise interact with) several pieces of equipment.

A cable connector 31 (FIGS. 3 through 3B) has several features which allow it to quickly and securely engage the cable-connector holder 42 on the front panel 41 of the rack 11. The features include a tapered screw 34, a protective shell 35 that encases the pins, and four hooks 33. The tapered screws (and to a much lesser extent the shell), in entering respective apertures in the panel, guide and properly align the cable connector with respect to the cableholder portion of the panel.

The tapered screws 34 enter the circular apertures 44 (FIGS. 2A and 2B). The cable-connector shell enters the connector aperture 45.

The conically tapered screw and its mating aperture in cooperation tend to center the connector properly in the aperture—and guide it very precisely into place for mating with the corresponding electronics-module panel connector. They thereby function as the guiding means mentioned in an earlier section of this document.

Equivalent guiding means, however, may include an aperture that is not circular or not wholly enclosed—with a matching screw profile—or may include a tapered projection from the panel, perhaps in cooperation with an aperture in the corresponding cable connector. Further, although I prefer to use a conically symmetrical taper, various other taper configurations (oval, triangular, etc.) could be adequate and equivalent, as could be two screws or pins each tapered on one respective side only (or angled in one respective direction only), so that the two elements do together, in conjunction, what perhaps neither one could do separately.

The four hooks 33 on the cable connector 31 can directly enter their corresponding slots 43 of the cableconnector holder 42. These hooks serve very well as the previously discussed connector-holder engaging or disengaging means, but various partial equivalents are believed to be within the scope of the appended claims. As suggested in connection with the cable-connector engaging or disengaging means, for example, features of these two means may be exchanged—so that slots are formed in the cable connector to engage hooks or other projections from the panel.

The cable connector 31 has a self-locking mechanism, which includes a latch 37 that is loaded by a spring 39 (FIGS. 3 and 3A). Also included is a cam 38 which works when the cable connector is pushed into the cable-connector holder. The cam engages the holder to temporarily move the latch out of a locked position. To disengage the cable connector from the cable-connector holder, a person manually compresses the latch 37 out of the locked position and pulls the cable connector out.

The combination of the above structures results in an enormous increase in efficiency. The cable connector can be attached easily and quickly with one hand.

The cable connector 31 includes a multiplicity of connector pins (not shown), which may be substantially conventional pins, or pins of novel types not currently known. The pins are mounted in the connector body 31 and protected by a shell 35. A cable 32 enters the cable connector at an opening 36 on a side of the cable connector such that the cable exits its connector at a ninety-degree angle to the pins.

Figure 4:
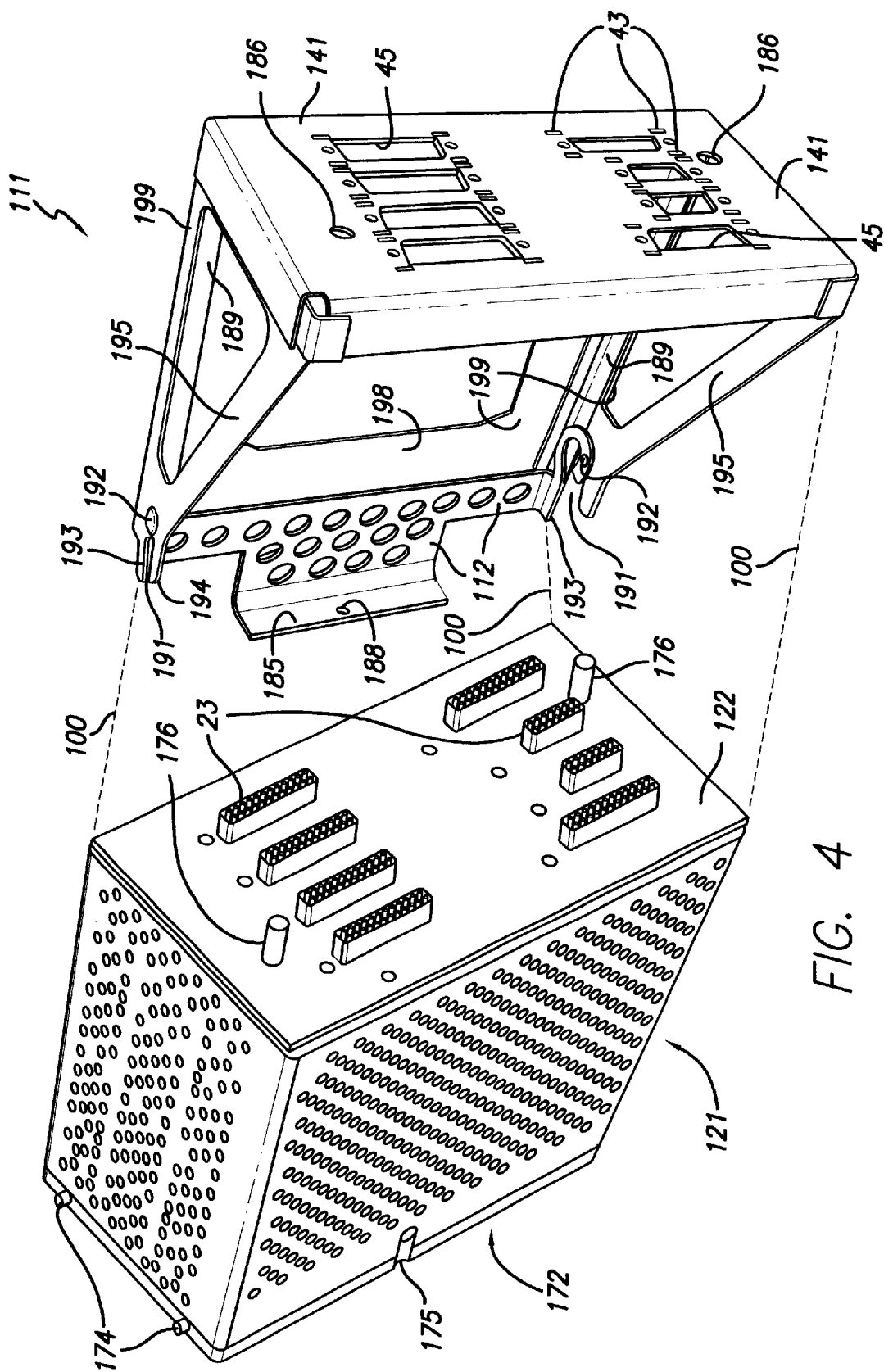
FIG. 4 is a view like FIG. 1 but of the present invention, and taken from above left.
Figure 11:
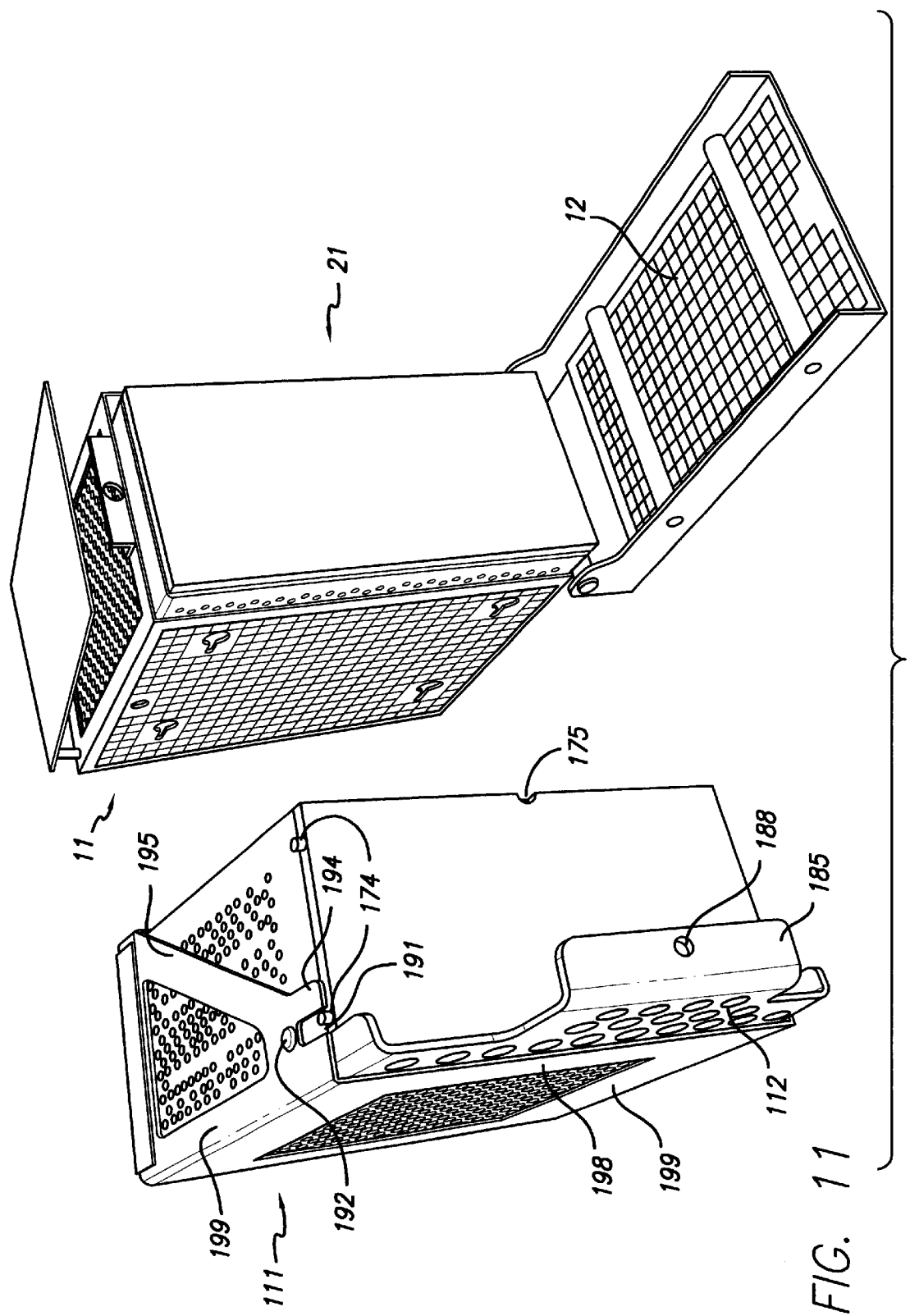
FIG. 11 is a composite view of the present invention and the precursor together for comparison, with the elements mutually in position generally as in FIG. 9—and taken from the rear and above right, with the door of each rack open.

Now turning to the mechanical refinements of the present invention, the improved rack 111 (FIGS. 4 through 12) is greatly reduced in bulk and weight as the drawings make clear. The rack 111 receives the module 121 generally along the lines of motion 100 (FIG. 4)—but does not fully enclose the module 121 as the earlier rack 11 enclosed the module 21.

At a mounting side the rack 111 has a rectangular lateral angle-iron-style frame 198–199 (but punched from a unitary-piece of aluminum sheet)—serving as a wall and mounting plate. Reinforcing low-friction glides 189 for the module 121 are fixed. inside the top and bottom angle-iron-style rails 199.

At the front the rack 111 has a rectangular front panel 141. Each outboard corner of that panel 141 is connected by a respective triangle brace or strut 195 (punched from the. same metal sheet as the frame 198–199) to a corresponding rear corner of the frame 198. Thus the current rack 111, rather than a full enclosure as before, is essentially a half-shell.

The panel 141 and the module front face 122, however, are substantially identical to the previous panels 41, 22 respectively, with regard to the basic functions described above for the precursor invention. Thus in the panel 141 of the new rack 111 the cable-connector holders 42 with all their various apertures 43, 45 are substantially identical to the holders 42 of the previous panel 41—and in the front face 122 of the new electronics module 121 (FIG. 4) the connectors 23 are likewise substantially identical to those of the previous module 21.

A small vertical door or half-door 112 forms a lever that is mounted to the rack for rotation about vertical hinge pins 192. The opposed top and bottom edges of the door are bent horizontal to form parallel guides or slides 193 for a purpose that will momentarily become clear.

Short extensions 194 of the upper and lower frame walls 195, 199 of the rack cooperate with the slides 193 to form upper and lower guide slots 191. This rack 111 has no lever arm or linkage like those 13 of the precursor rack 11; instead a small compound cam 113, 114 (best seen in FIGS. 8 and 10) is formed in or as an extension of each slide 193, adjacent to the hinge pin 192.

Part of the functionality of the previous lever arm or linkage 13 is now shifted to the new electronics module 121, which has upward and downward laterally extending posts 174 mounted at the rear edge of the top surface of the module 121. Identical posts (not seen) are mounted at the rear edge of the bottom surface of the module 121.

One of the top posts 174 and one of the bottom posts align respectively with the upper and lower slides 193 and guide slots 191 when the module 121 is first placed in an entry position (FIG. 5) in the rack 111. The module is then manually pushed forward (FIG. 7) so that the posts 174 move along the slides 193 and toward the slots 191.

Figure 15:
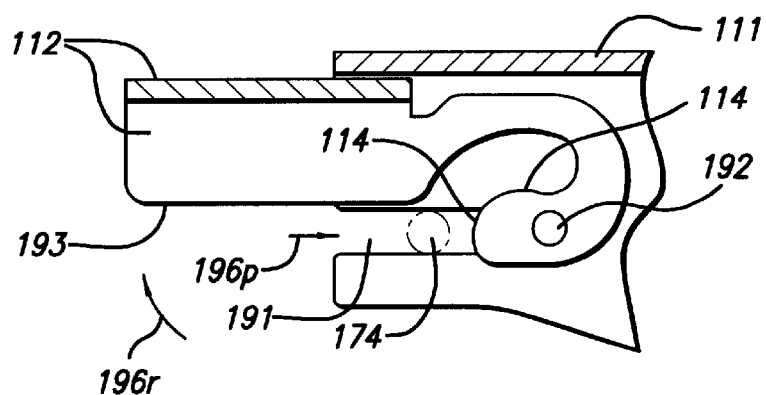
FIG. 15 is a plan, considerably enlarged, of the FIG. 8 door-hinge and cam mechanism in a condition intermediate between those of FIGS. 7 and 9.
Figure 16:
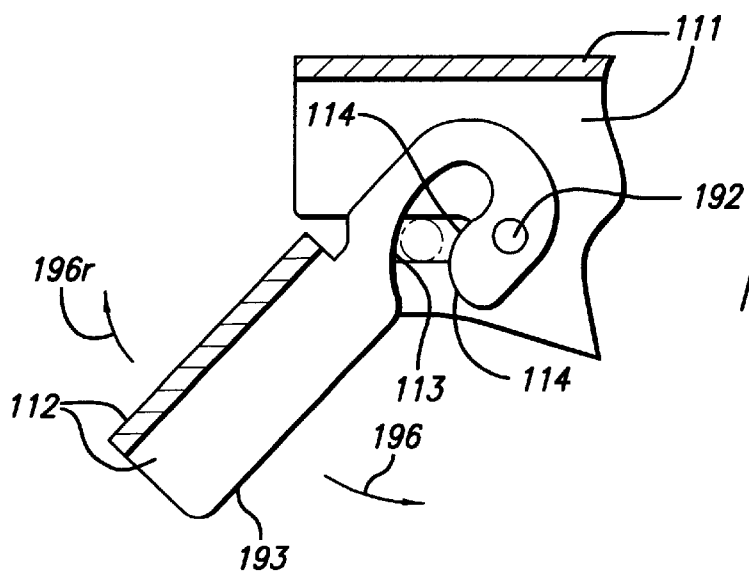
FIG. 16 is a like view but corresponding to the mechanism in the position of FIGS. 9 and 10.

The module can be pushed further forward 196p (FIG. 15) until the posts are well within the slots. If preferred, as the upper post 174 and lower post reach the mouths of the slots 191 the half-door 112 can instead be manually rotated, acting as a lever, so that the slides 193 impel (not shown) the posts into the guide slots 191.

Figure 17:
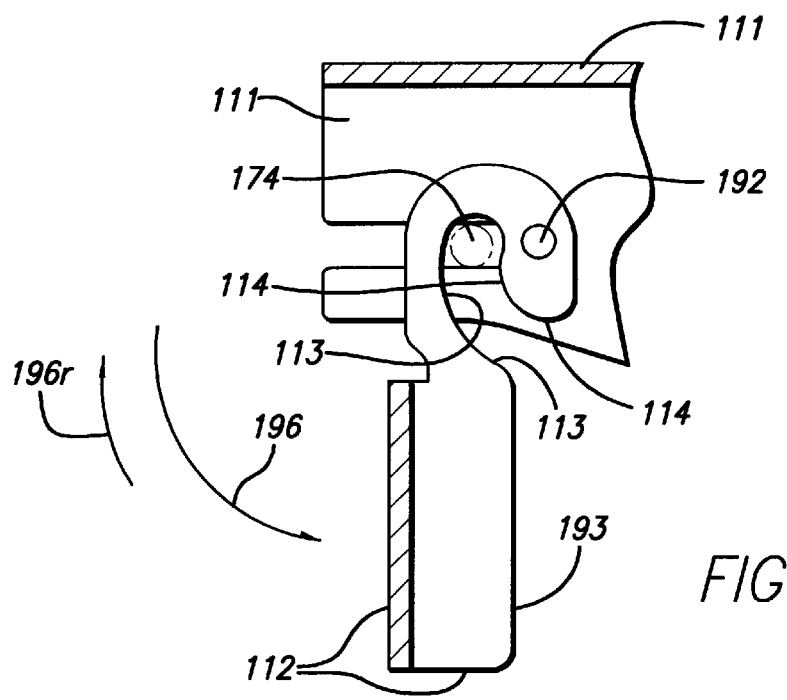
FIG. 17 is a like view but with the mechanism in a condition advanced beyond that of FIGS. 9, 10 and 16 to a fully installed position of the module.

In either event, continuing the installation (i.e. beyond the positions of FIGS. 7 and 15), once the posts have advanced well within the slots (FIG. 9) the half-door is manually rotated 196 to bring the concave arcuate cam segments 113 (FIGS. 8, 10, 16 and 17) into engagement with the posts to forcibly draw the electronics module 121 into the rack 111. If the module is properly oriented to the rack, installation is complete (FIG. 17).

More specifically, if the module is properly oriented, offset alignment rods 176 on the front face 122 of the module pass through matching alignment holes 186 in the rack panel 141, permitting the module to shift fully into position. In that position the panel connectors 23 pass through the cable-connector holders 42 and seat in the cable connectors 31 (FIGS. 1 through 3).

If the module is inverted, however, the offset alignment rods 176 instead butt against the interior surface of the panel 141, obstructing advancement of the module into the rack and thereby preventing pin damage in the connectors 23, 31. Such damage might otherwise result from forcible engagement of any of the connectors with the panel 141 or with portions of mismatched connectors. The alignment rods 176 represent a second element of functionality that now resides in the electronics module.

As the module is fully inserted and the connectors seat, the door 112 comes essentially flush against the rear surface of the electronics module. As that operation is completed, the spring-loaded pin 187 (FIGS. 12 and 13) is deflected outward and then drops into a retaining aperture 175 (FIGS. 4, 5 and 11) at the rear outboard edge of the module. (The pin 187 is mounted to the lever handle 185 by a through-hole 188, FIGS. 4, 5 and 11.)

The aperture 175 represents a third element of functionality that now resides in the. electronics module, rather than in the rack. Simplicity and clean lines of that module are thus traded off, in the configuration of the present invention, against weight and bulk—which as well known are of paramount importance in aircraft.

To remove the module 121 from the rack 111, a user manually pulls the retaining pin 187 outward and then rotates the half-door 112 rearward 196r (FIG. 17) to bring the convex arcuate cam segments 114 into engagement with the posts. This action forcibly ejects (FIGS. 17, then 16 and finally 15) the posts from the guide slots 191 and thereby impels the. electronics module away from the rack end wall 141—unseating all the connector pins so that the module can then be very easily withdrawn manually from the rack.

As described above, the cam 113–114 is formed as part of the door/lever 112 in the rack 111, while the follower 174 is part of, or mounted to, the electronics module 121. In principle these functionalities can be reversed—i.e., the cam can be associated with the module and the follower with the rack.

In general this is true of all the functionalities that operate across this pair of devices. Thus for example the alignment holes 185 and rods 176, and the retaining pin 187 and aperture 175 as well, in theory may be associated with the module and rack respectively—rather than assigned to the rack and module as specifically disclosed above. Furthermore the lever action, if desired, can be applied to move the cam follower rather than the cam. All the configuration that is specifically disclosed above, however, has been established by careful analysis and proved out by very extensive trial and error, and therefore is considered strongly advanced over the various alternatives just mentioned here.

Figure 13:
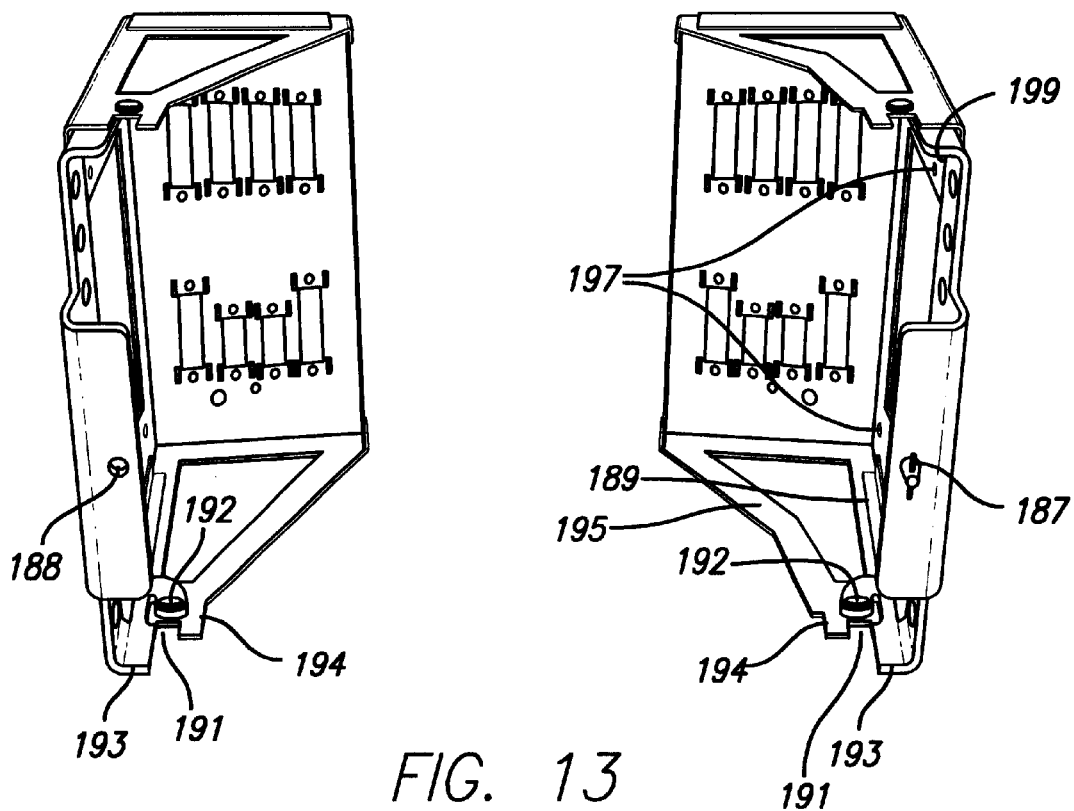
FIG. 13 is a rear view like FIG. 11 but showing only the rack of the present invention, and particularly illustrating two forms of the rack having opposite handedness to accommodate opposed installation requirements.
Figure 14:
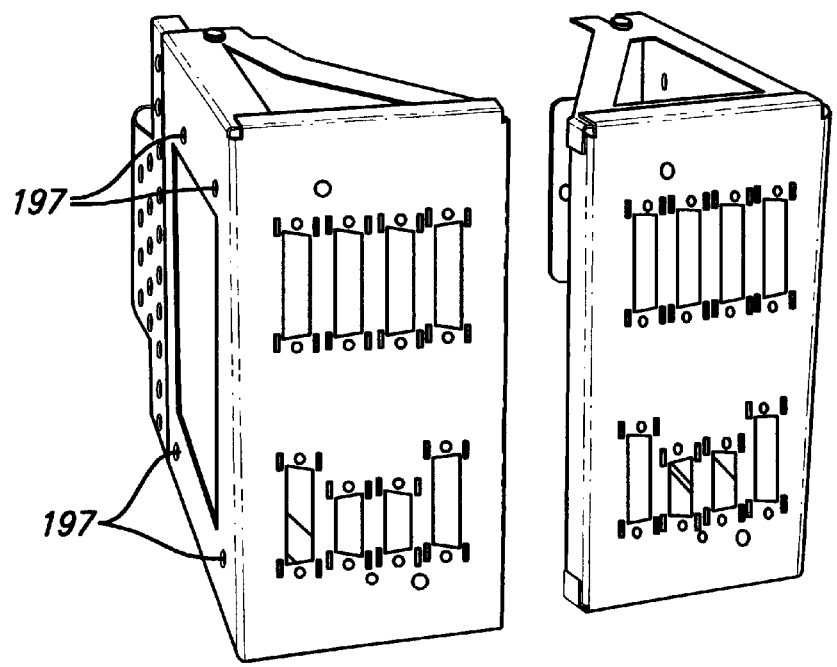
FIG. 14 is a view like FIG. 13 but taken from the front.

Only one post 174 at the top and one at the bottom are used in any installation, depending on whether the overall assembly 111–121 is to be mounted to a left- or right-side stanchion (not shown) of the host aircraft etc. To accommodate opposite-handedness installations the rack is advantageously made up in mirror-image versions (FIGS. 13 and 14). These versions provide a metal wall, and mounting holes 197 in the wall, at only the respective side where a mounting stanchion is present.

If preferred, inverted installation of the electronics module can be permitted, and the cost of inventorying such mirror-image versions thereby avoided. Such cost, however, is quite nominal and this option is accordingly considered less desirable because of the resulting confusion as to connector location and orientation throughout the life of the installation.

The above disclosure is intended as merely exemplary, and not to limit the scope of the invention—which is to be determined by reference to the appended claims.

What is claimed is:

1. Apparatus for making or breaking electrical connections between at least one electrical cable connector and an electronics module that has at least one corresponding panel connector, and that carries module camming means; said apparatus comprising:
    an exclusively mechanical, nonelectrical intermediary between the cable connector and electronics module;
    said intermediary comprising:
        a rack for receiving and holding the electronics module, and at least one cable-connector holder, formed in the rack, for receiving and holding the at least one cable connector in positions aligned with the at least one panel connector when the electronics module is held in the rack;

rack camming means for engagement with the module camming means;

a lever fixed to one of the rack and module for operating the rack camming means or module camming means to forcibly shift the module relative to the rack, so as to engage or disengage the at least one panel connector and the at least one cable connector.

2. The apparatus of claim 1, wherein:

each cable-connector holder comprises means for easily and quickly engaging, or disengaging from, a corresponding cable connector.

3. The apparatus of claim 1, further comprising:

offset alignment rods projecting forward from the module, and through holes in the rack when properly aligned, to prevent inverted installation.

4. The apparatus of claim 3, wherein:

the alignment rods are long enough to stop said forcible shift of the module toward the rack before the panel connectors engage the cable connectors, in event of attempted inverted installation.

5. The apparatus of claim 1, for use with an electronics module that weighs at least several pounds, and wherein:

the lever is a single lever for manual actuation by one hand; and the camming means bodily move the electronics module.

6. The apparatus of claim 5, wherein:

the camming means comprise substantially duplicate cam-and-follower sets at opposed sides of the module, both sets operated by said single lever when manually actuated by one hand.

7. The apparatus of claim 5, wherein the rack camming means comprise:

a first cam segment for forcible drawing of the module into the rack to firmly seat the panel connector with the cable connector; and a second cam segment for forcible ejection of the module slightly out of the rack to unseat the panel connector from the cable connector.

8. The apparatus of claim 7, wherein:

the first segment has a concave arcuate surface for pulling the follower; and the second segment has a convex arcuate surface for pushing the follower.

9. The apparatus of claim 8, wherein:

the cam is formed in the lever; and the follower is a post projecting laterally from the module to engage the cam.

10. The apparatus of claim 7, wherein:

the lever is hinged to the rack;

the cam is formed in the lever; and the follower is a post projecting laterally from the module to engage the cam.

11. The apparatus of claim 10, further comprising:

fastening means on the lever for helping to secure the lever, and the rack and module, in a fully engaged condition.

12. The apparatus of claim 11, wherein:

the fastening means comprise a latch pin for engaging an aperture in the module.

13. The apparatus of claim 12, further comprising:

offset alignment rods projecting forward from the module, and through holes in the rack when properly aligned, to prevent inverted installation.

14. The apparatus of claim 13, wherein:

the alignment rods are long enough to stop said forcible drawing before the panel connectors engage the cable connectors, in event of attempted inverted installation.

15. An electrical interconnection system comprising:

at least one electrical cable connector;

an electronics module that has at least one corresponding panel connector;

a rack for receiving and holding the electronics module;

at least one cable-connector holder, formed in the rack, for receiving and holding the at least one cable connector in positions aligned with the at least one panel connector when the electronics module is held in the rack;

a cam and cam-follower, said cam being associated with one of the rack and module, and said follower being associated with another of the rack and module;

a lever fixed to one of the rack and module for operating the cam or follower to forcibly shift the module relative to the rack, so as to engage or disengage the at least one panel connector and the at least one cable connector.

16. The apparatus of claim 15, wherein:

each cable-connector holder comprises means for easily and quickly engaging, or disengaging from, a corresponding cable connector.

17. The apparatus of claim 15, further comprising:

offset alignment rods projecting forward from the module, and through holes in the rack when properly aligned, to prevent inverted installation.

18. The apparatus of claim 17, wherein:

the alignment rods are long enough to stop forcible shift of the module toward the rack before the panel connectors engage the cable connectors, in event of attempted inverted installation.

19. The apparatus of claim 15, wherein:

the electronics module weighs at least several pounds;

the lever is a single lever for manual actuation by one hand; and the cam and follower bodily move the electronics module.

20. The apparatus of claim 19, wherein:

the cam and follower comprise substantially duplicate cam-and-follower sets at opposed sides of the module, both sets operated by said single lever when manually actuated by one hand.

21. The apparatus of claim 19, wherein the cam comprises:

a first segment for forcible drawing of the module into the rack to firmly seat the panel connector with the cable connector; and a second segment for forcible ejection of the module slightly out of the rack to unseat the panel connector from the cable connector.

22. The apparatus of claim 21, wherein:

the first segment has a concave arcuate surface for pulling the follower; and the second segment has a convex arcuate surface for pushing the follower.

23. The apparatus of claim 22, wherein:

the cam is formed in the lever; and the follower is a post projecting laterally from the module to engage the cam.

24. The apparatus of claim 23, wherein:

the lever is hinged to the rack;

the cam is formed in the lever; and the follower is a post projecting laterally from the module to engage the cam.

25. The apparatus of claim 24, further comprising:

fastening means on the lever for helping to secure the lever, and the rack and module, in a fully engaged condition.

26. The apparatus of claim 25, further comprising:

offset alignment rods projecting forward from the module, and through holes in the rack when properly aligned, to prevent inverted installation.

27. An electrical interconnection system comprising:

at least one electrical cable connector;

an electronics module that weighs at least several pounds and has at least one corresponding panel connector, and that defines an aperture at a rear surface of the module;

a rack for receiving and holding, but substantially only half-enclosing, the electronics module;

at least one cable-connector holder, formed in the rack, for receiving and holding the at least one cable connector in positions aligned with the at least one panel connector when the electronics module is held in the rack;

a single lever hinged to the rack, behind the module when the module is in place, for manual actuation by one hand;

substantially duplicate cams at opposed sides of the rack, both formed in and operated by the lever;

substantially duplicate cam-follower posts projecting laterally from opposed sides of the electronics module, for engagement with the cams respectively to forcibly and bodily shift the module relative to the rack when the lever is actuated, to engage or disengage the at least one panel connector and the at least one cable connector;

each cam having a first concave arcuate segment for forcible drawing of the module into the rack to firmly seat the panel connector with the cable connector, and a second convex arcuate segment for forcible ejection of the module slightly out of the rack to unseat the panel connector from the cable connector;

a spring-loaded latch pin on the lever for engaging the aperture defined at the rear surface of the module, for helping to secure the lever, and the rack and module, in a fully engaged condition;

offset alignment rods projecting forward from the module, and through holes in the rack when properly aligned, to prevent inverted installation;

said alignment rods being long enough to stop said forcible drawing before the panel connectors engage the cable connectors, in event of attempted inverted installation.

28. The apparatus of claim 27, wherein:

each cable-connector holder comprises means for easily and quickly engaging, or disengaging from, a corresponding cable connector.

29. A method of interconnecting numerous cable connectors with corresponding numerous panel connectors of an electronics module that has opposed laterally projecting posts, using a rack that receives the module at one side of the rack and receives the panel connectors at another side of the rack and that has a single hinged lever carrying opposed cams formed in the lever for engaging the posts; said method comprising the steps of:

inserting the electronics module partway into the rack; and then operating the lever with one hand to actuate the cams against the posts so as to bodily shift the module further into the rack and thereby seat all the cable connectors and corresponding panel connectors substantially simultaneously.

* * * * *